United States Patent [19]
Mueller et al.

[11] Patent Number: 5,545,999
[45] Date of Patent: Aug. 13, 1996

[54] PREAMPLIFIER CIRCUIT FOR MAGNETIC RESONANCE SYSTEM

[75] Inventors: Otward M. Mueller, Ballston Lake, N.Y.; Christopher P. Yakymyshyn, Raleigh, N.C.; Peter B. Roemer, North Andover, Mass.; Ronald D. Watkins, Niskayuna, N.Y.

[73] Assignee: General Electric Company, Schenectady, N.Y.

[21] Appl. No.: 407,825

[22] Filed: Mar. 21, 1995

[51] Int. Cl.⁶ .................................................. G01V 3/00
[52] U.S. Cl. .................................... 324/322; 324/318
[58] Field of Search .................................. 324/322, 318, 324/314, 307, 309; 128/653.5

[56] References Cited

U.S. PATENT DOCUMENTS 4,737,712  4/1988  Stormont et al. ...................... 324/322
4,763,075  8/1988  Weigert ................................... 324/318
5,245,288  9/1993  Leussler ................................. 324/322

Primary Examiner—Louis M. Arana
Attorney, Agent, or Firm—Marvin Snyder

[57] ABSTRACT

A circuit for amplifying signals received by the receive coil of a magnetic resonance (MR) system includes a preamplifier employing an active circuit device, such as a GaAs-MESFET or HEMT. The preamplifier is located proximate to the receive coil in order to maintain as high a signal-to-noise ratio as possible for the preamplifier output signals. A capacitance is coupled to the receive coil to form an input impedance matching network for the input of the preamplifier. The preamplifier output is coupled through a fiber optic cable to remotely located MR signal processing electronics, which further processes signals received by the MR receive coil and amplified by the preamplifier.

17 Claims, 4 Drawing Sheets

PREAMPLIFIER CIRCUIT FOR MAGNETIC RESONANCE SYSTEM

BACKGROUND OF THE INVENTION

This invention generally pertains to a system for pre-amplifying signals detected by the receive or reception coil of a magnetic resonance (MR) system and, more particularly, to such system wherein the preamplification circuitry is optically isolated from other system electronics, hereinafter referred to collectively as MR signal processing electronics, which receives and further processes pre-amplified MR signals from the preamplification circuitry.

In an MR system, whether designed for spectroscopy, imaging or other application, an RF pulse is transmitted into a subject of interest (e.g., body tissue). In response, the subject emits a signal which is detected by an MR receive coil and thereafter processed to obtain information about the subject.

MR signals detected by the receive coil are inherently very weak and therefore require preamplification before further signal processing can take place. Common practice is to connect a preamplifier to the MR receive coil by means of a relatively long electric cable. Preamplifier components typically include a first impedance matching network connected between the receive coil and the cable input, a remotely located active preamplifier device, such as a GaAs-MESFET (gallium arsenide metal-semiconductor field-effect transistor) or HEMT (high electron mobility transistor), and a second impedance matching network connecting the cable output to the active device input. The second matching network is required to match the output impedance of the cable, which is on the order of 50 ohms, to the input impedance of a device such as a GaAs-MESFET, which is on the order of 1200 ohms, for optimal noise performance.

Noise in the cable and the respective components of the preamplifier may be very serious, in view of the comparative weakness of received MR signals. If the level of noise collectively resulting from these noise sources is too great, the preamplifier will not be able to achieve a signal-to-noise ratio that is high enough to enable the signal processing electronics to further process the received MR signals. Even more noise may be present if the system uses multiple receive coils, each of which is separately coupled to a respective preamplifier through a respective electric cable. For example, in a phased array configuration, numerous signal receive coils are positioned together, and each must be precisely tuned. Maintaining proper tuning of each coil is very difficult with the conventional arrangement of one electric cable for each coil.

SUMMARY OF THE INVENTION

Briefly, in accordance with a preferred embodiment of the invention, a preamplifier for a magnetic resonance system which significantly reduces noise and correspondingly boosts the signal-to-noise ratio to a level sufficiently high to ensure acceptable quality in signal processing includes an active preamplification device having an input and an output, and an associated noise figure. The noise figure is preferably on the order of no more than 0.3–0.5 dB, and the active amplification device preferably comprises an HEMT or a GaAs-MESFET.

In a significant departure from prior art systems of the type referred to above, the active preamplification device of the invention is located proximate to the MR receive coil, rather than remote therefrom. Thus any noise arising in the cable is not amplified by the preamplifier. The invention further includes means for establishing an optically isolated signal transmission path between the output of the active preamplification device and the signal processing electronics, thereby eliminating the need for the second impedance matching network, referred to above.

The invention further includes means coupled between the receive coil of the MR system and the active preamplification device, for forming an input network therebetween. The MR receive coil is an integral component of the matching network, and the network is configured to comprise a resonant circuit of selected Q. By eliminating the second impedance matching network, significant losses are avoided. Accordingly, Q may be increased, relative to prior art devices, to significantly sharpen reception by the MR receive coil at the resonant frequency of the circuit. This resonant frequency may be selectively adjusted to the exact frequency of the MR signal to be received at a particular time. The strength of the signal to be detected by the MR receive coil is thereby significantly increased.

The input matching network is preferably formed by coupling a tunable capacitor to the MR receive coil, the capacitor and MR receive coil together forming the resonant circuit of selected Q. The tunable capacitor is used to adjust the resonant frequency of the circuit, as required. The transmission path also preferably comprises an optic fiber coupled between a first diode for receiving output signals from the preamplication device, and a second diode coupled to the signal processing electronics.

In a preferred embodiment of the invention, two series-coupled capacitors are included in the matching network, one being tunable, and the other being coupled to match the input impedance of the preamplification device, which is on the order of 1200 ohms. It has been found that a device such as a GaAs-MESFET has an optimal noise figure (i.e., generates the least amount of noise) when matched at such impedance level.

An object of the invention is to significantly reduce noise level, and to correspondingly boost signal-to-noise ratio, in a preamplifier circuit for a magnetic resonance system, to ensure that such ratio is at the level required for effective MR signal processing.

Another object is to significantly reduce the level of noise which is coupled through the preamplifier of an MR system along with a received MR signal.

Another object is to simplify, and reduce the number of components required for, the preamplifier circuit of an MR system.

Another object is to provide a transmission path from the receive coil of an MR system to remotely located post-preamplification processing electronics wherein signals along the path are not disturbed by electromagnetic radiation in the MR environment.

Another object is to provide a preamplifier for an MR system wherein power and control signals for the preamplifier are coupled thereto through corresponding optical paths.

Another object is to provide a preamplifier circuit for an MR system wherein the MR receive coil is an integral part of an input matching network for the preamplifier.

BRIEF DESCRIPTION OF THE DRAWINGS

The features of the invention believed to be novel are set forth in the appended claims. The invention, however, together with further objects and advantages thereof, may best be understood by reference to the following description taken in conjunction with the accompanying drawings in which:

DETAILED DESCRIPTION

Figure 1:
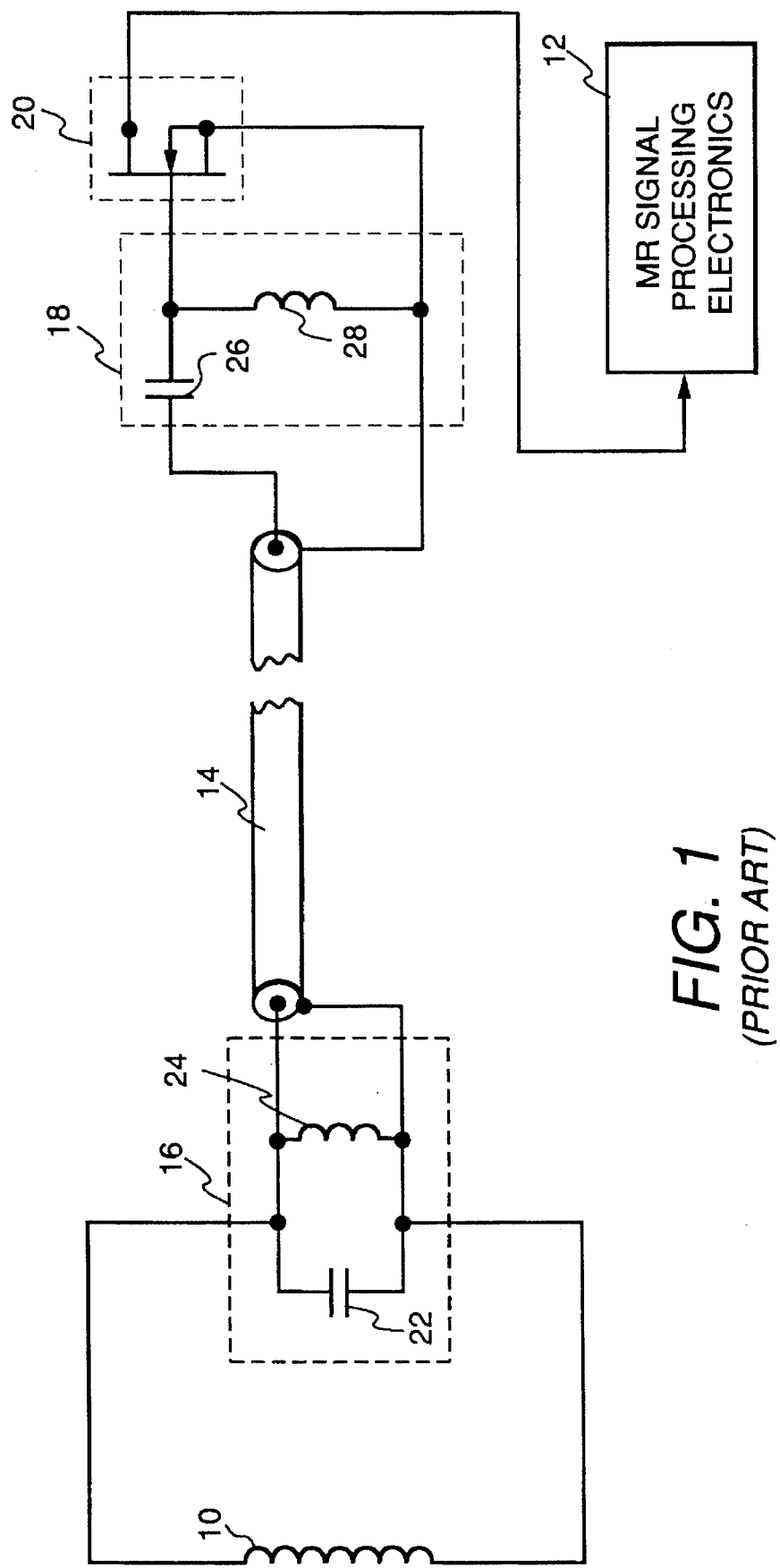
FIG. 1 is a schematic diagram of a prior art arrangement for connecting an MR receive coil to a preamplifier.

FIG. 1 schematically illustrates an MR receive or reception coil 10 for a magnetic resonance system (not shown), such as may be used for spectroscopy or imaging. Signals generated in the course of the MR process are detected by receive coil 10 and amplified by a preamplifier 20 comprising an active circuit device. The amplified signals are provided to MR signal processing electronics 12 for further amplification and other processing in order to extract information from the signals. Coil 10 may be the only receive coil in its associated MR system, or may be one of a number of multiple coils. As stated above, MR signal processing electronics 12 refers to the entire package of processing electronics conventionally employed in an MR system at the output of the preamplifier.

Signal processing electronics 12 typically is located at a substantial distance from MR receive coil 10 (e.g. twenty feet or more). Accordingly, an electric cable 14, such as a coaxial cable, is used in prior art systems to provide a transmission path for the signals from coil 10 to signal processing electronics 12. However, electromagnetic radiation which is present in the MR environment tends to generate significant levels of noise in signals carried by cable 14. Noise in the transmission path of received MR signals is particularly objectionable, since the initial strength levels of such signals is comparatively low. Moreover, typical prior art systems employ an input matching network 16 between coil 10 and the input of cable 14, and an output matching network 18 between the cable output and the input to preamplifier 20. Matching networks 16 and 18 may become additional sources of noise in the MR signal transmission path.

To minimize the level of noise introduced into the transmission path by preamplifier 20, an active device such as a GaAs-MESFET or HEMT may be used to perform the preamplification. Such devices exhibit very low noise, and input capacitance is on the order of one picofarad. This very small input capacitance results in high input impedance, and therefore high voltage gain. However, because of the high input impedance of the preamplifier (on the order of 1200ohms for a MESFET operated to achieve an optimal noise figure) network 18 is required to match the output impedance of cable 14, which is on the order of 50 ohms, to the high input impedance of preamplifier 20, when a GaAs-MESFET is used to perform the preamplification. Network 16 is needed to match the 50 ohm cable input impedance to the impedance of receive coil 10 and, as shown in FIG. 1, comprises a parallel-connected capacitor 22 and inductor 24. Network 18 comprises a series capacitor 26 and a shunt inductor 28. The output of preamplifier 20 is coupled to the input of MR signal processing electronics 12.

Figure 2:
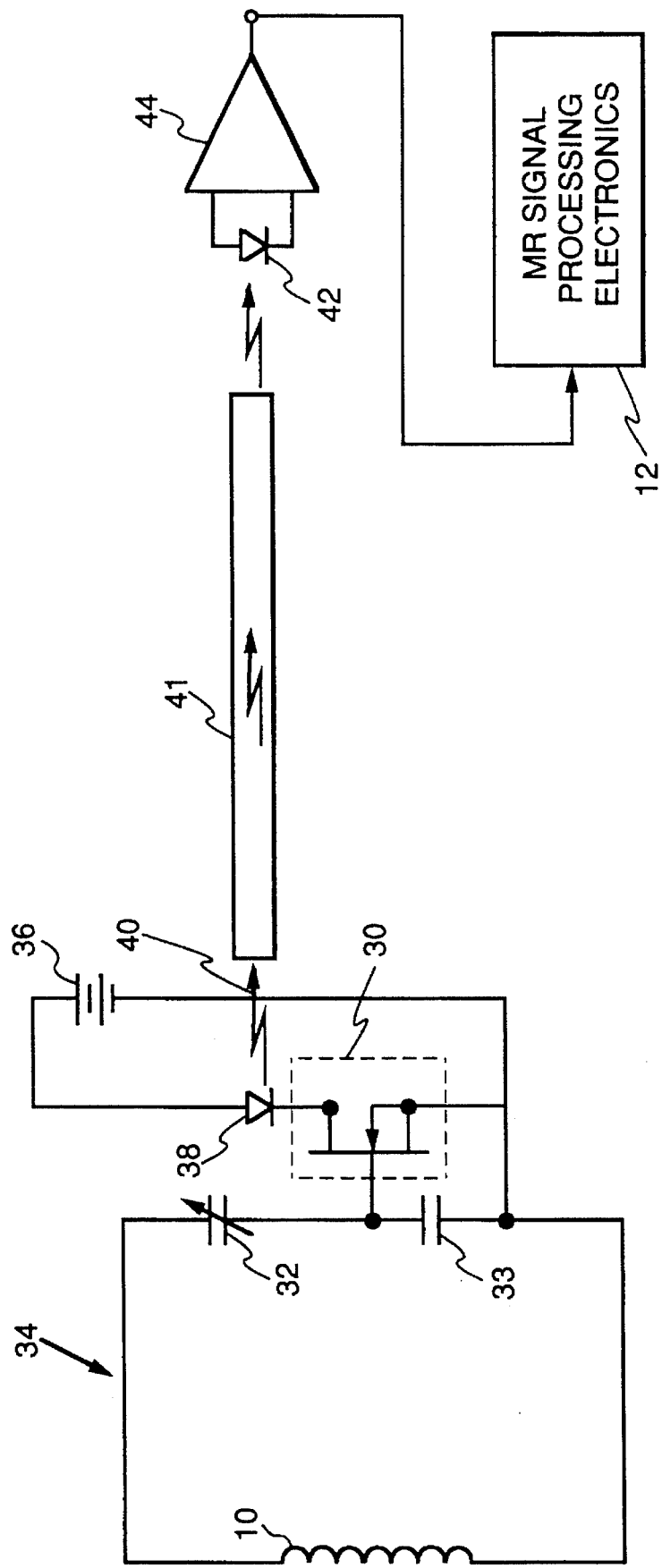
FIG. 2 is a schematic diagram of one embodiment of the invention.

FIG. 2 shows a preamplifier 30 for amplifying signals received by MR receive coil 10, wherein the preamplifier is located proximate to coil 10, rather than located remotely therefrom as in the prior art. By use of this arrangement, noise introduced into signals carried by cable to MR signal processing electronics 12 is not amplified by preamplifier 30. In this circuit arrangement, an input matching network 34 coupled to the input of preamplifier 30 is constructed of a tunable capacitor 32 in series with a fixed capacitor 33, the two capacitors being connected in parallel with receive coil 10 to form an LC resonant circuit. By making coil 10 an integral part of input matching network 34, the need for an additional coil, such as coil 24 of network 16 shown in FIG. 1, is eliminated. As a result, the figure of merit Q of the LC resonant network formed by coil 10 and capacitors 32 and 33 is much higher than the Q of network 16 in the system shown in FIG. 1. Moreover, because there is no need for a second input matching network for the preamplifier, due to the lack of any requirement to pass unamplified signals from receive coil 10 through a cable prior to their application to the preamplifier, this elimination of the second matching network required by the prior art (i.e., network 18 of FIG. 1) and the resistance associated therewith results in a still higher value of Q. The increased value of Q of the resonant circuit results in the detected MR signal being stronger and of narrower bandwidth. This is very desirable in MR systems, wherein frequency discrimination is very important. By strengthening the received signal, LC resonant circuit 34 serves to increase signal-to-noise ratio.

As shown in FIG. 2, the input signal to preamplifier 30 is applied across capacitor 33. Usefully, preamplifier 30 is comprised of a GaAs-MESFET or HEMT, as described above. By providing separate capacitors 32 and 33 for LC network 34, capacitor 32 may be adjusted to selectively tune the network, while capacitor 33 is selected to have a reactance value that matches the input impedance of preamplifier 30, such as a capacitance on the order of 1 picofarad, which, at the frequency of the signal received by coil 10, matches the 1200 ohm optimal input impedance of a GaAs-MESFET transistor.

FIG. 2 further shows a power supply 36 for the transistor of preamplifier 30, and a diode 38 coupled to the transistor drain or output thereof. Diode 38 comprises a semiconductor light emitter, such as a laser diode or a light emitting diode (LED), and operates to produce a light signal 40. The light signal produced by diode 38 is modulated by the output current of preamplifier 30 so as to represent the received MR signals provided to amplifier 30 through input matching network 34.

The embodiment of FIG. 2 employs a fiber optic cable (FOC) 41 positioned to couple light signals 40 from diode 38 to the location of signal processing electronics 12. An optically responsive semiconductor device 42 such as a photodiode or solar cell located proximate to signal processing electronics 12 converts light signals 40 received through cable 41 into corresponding electrical signals, which are supplied to an amplifier 44 and from there to signal processing electronics 12.

It will be seen that information-bearing MR signals, transmitted along fiber optic cable 44 in the form of light signals, will not be distorted by electromagnetic radiation present in the MR environment. Also, as stated above, using a fiber optic transmission path, rather than an electric cable, eliminates any need for an output matching network, such as network 18 in the system shown in FIG. 1.

Figure 3:
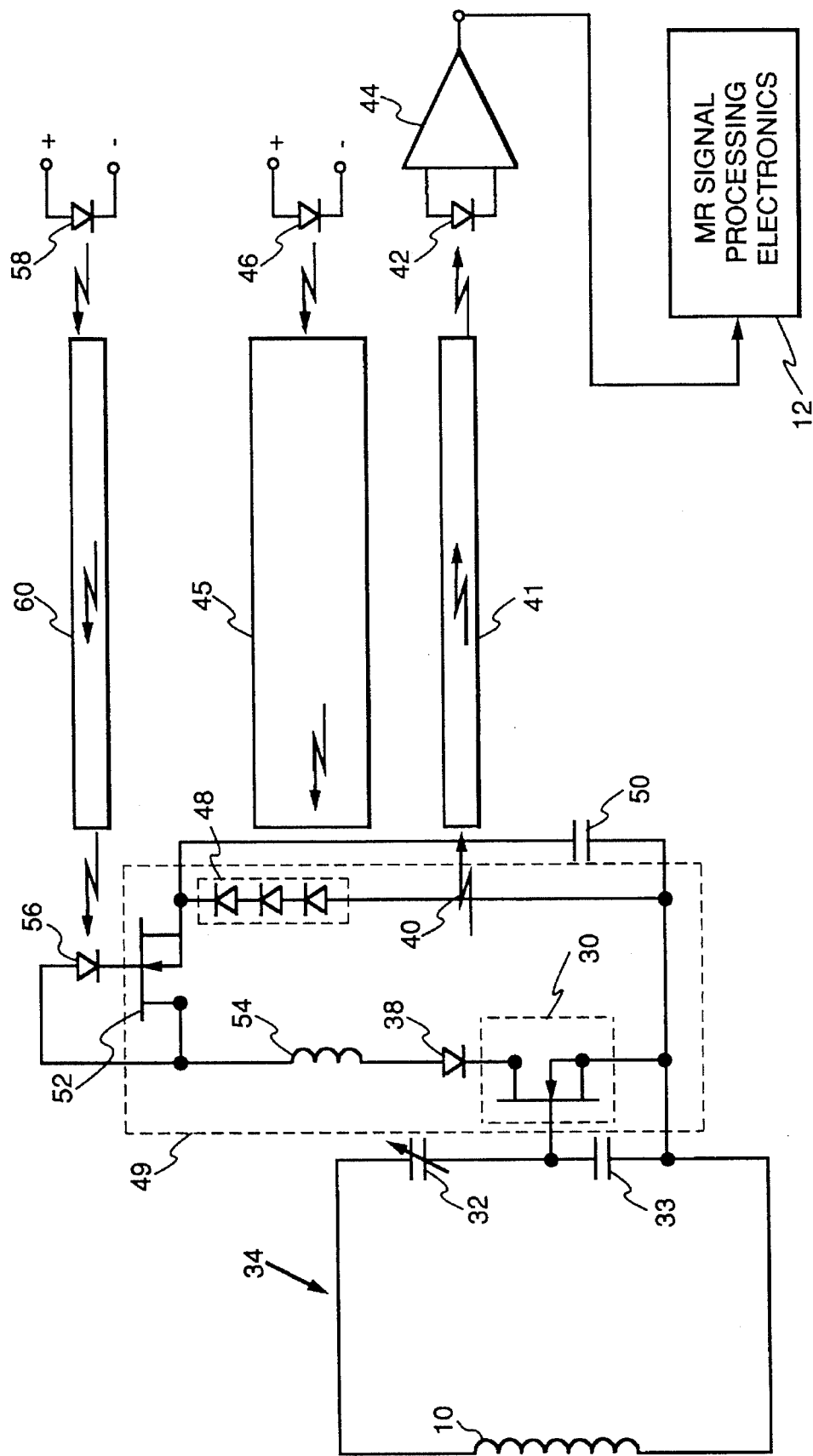
FIG. 3 is a schematic diagram of a second embodiment of the invention.

FIG. 3 illustrates an embodiment of the invention wherein power required for operation of preamplifier 30 is supplied from a remote location through a fiber optic cable 45. Cable 45 receives light from a laser diode or LED 46, and is of diameter larger than fiber optic cable 41 so as to be capable of illuminating an array of three or more series-coupled photodiodes or solar cells 48. The electrical output signal of cells 48 is stored in a capacitor 50, coupled in parallel therewith.

A GaAs MESFET can draw a relatively large current (5–50 mA) for optimum noise biasing. In order to minimize power dissipation of such device when used as preamplifier 30, a transistor 52, operable as a switch, is coupled in a series circuit 49 with a capacitor 50, the output of preamplifier 30 (corresponding to the source and drain terminals of the transistor employed as the preamplifier), a diode 38 and an inductor 54. A photodiode or solar cell 56 is coupled to selectively operate transistor 52. Transistor 52 is turned on by coupling a light signal to diode 56 from a remote location through a fiber optic cable 60. In absence of the light signal, transistor 52 is switched off, preventing power from flowing through series circuit 49 to the transistor of preamplifier 30. This light signal is provided by a remotely located laser diode or LED 58.

The respective elements shown to the left of the fiber optic cables, as viewed in FIG. 3, can be combined with preamplifier 30 into a very small circuit configuration fully integrated with receive coil 10, at the location of the receive coil in the MR system. If the MR system includes multiple reception coils 10, a separate preamplifier and associated circuitry, of the type shown in FIG. 3, can be provided for each coil, each such preamplifier being coupled to the signal processing electronics 12 through a corresponding fiber optic cable, respectively.

Figure 4:
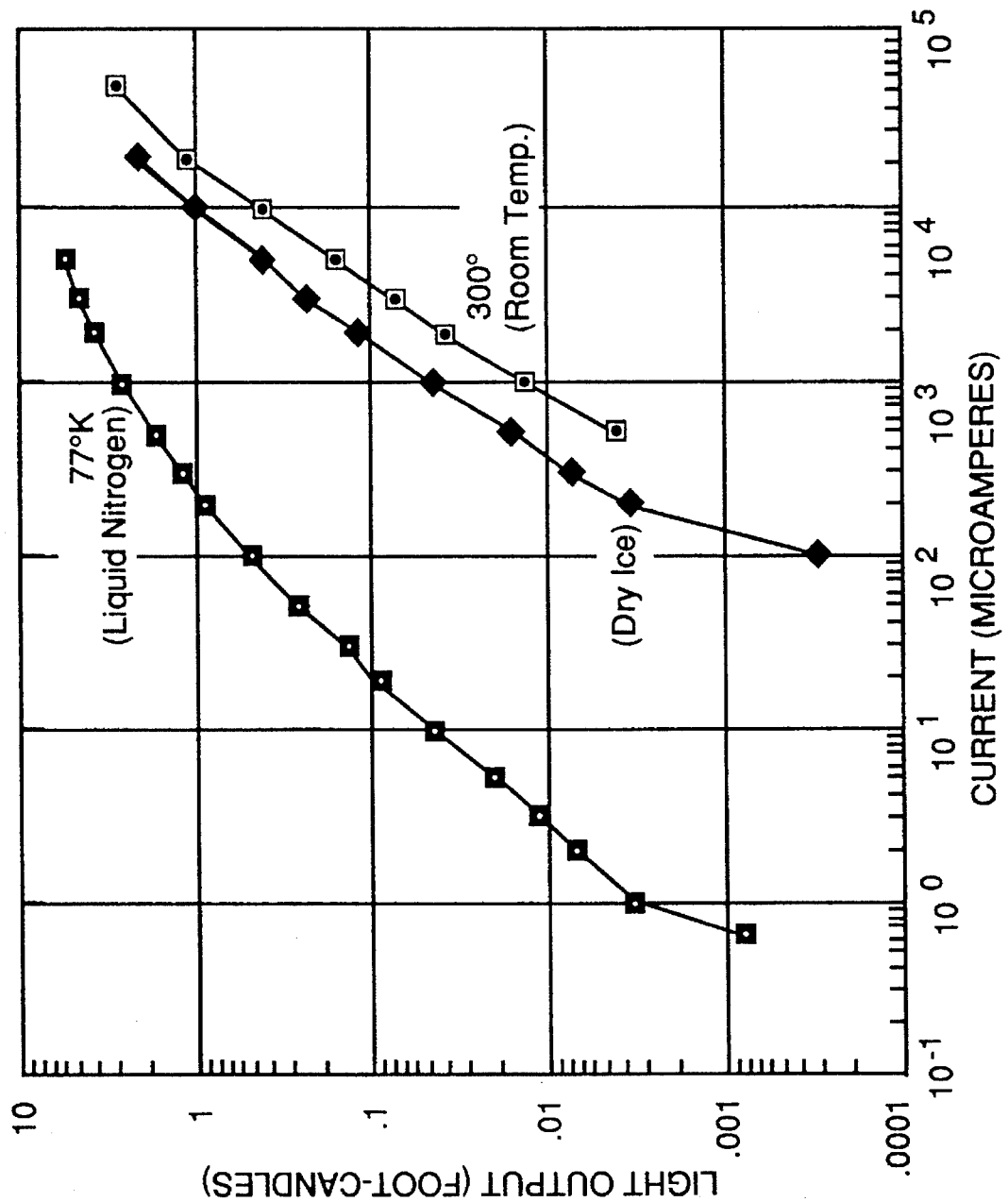
FIG. 4 is a graph of light output versus current for an LED incorporated into the embodiment of FIG. 2 or FIG. 3, wherein temperature of the LED is varied.

FIG. 4 shows the light output, in foot-candles, of a yellow-light emitting diode, specifically a CMD 5491 (GI), which may be used as diode 38 in the embodiments shown in FIGS. 2 and 3. The light output is measured as a function of diode current at room temperature (300 degrees K.) and at the temperatures of dry ice, and liquid nitrogen (77 degrees K.). From FIG. 4, it is apparent that the light output/current transfer function increases substantially if the diode is cryogenically cooled, for example, by immersion in liquid nitrogen. For a diode current of one milliampere, the light output is increased approximately 100 times by decreasing the diode temperature from room temperature to the temperature of liquid nitrogen. This indicates that the dynamic range, noise figure and signal-to-noise ratio of the circuit shown in FIGS. 2 and 3 can be significantly improved by cooling diode 38. Performance may also be improved by cooling preamplification device 30.

While only certain preferred features of the invention have been illustrated and described, many modifications and changes will occur to those skilled in the art. It is, therefore, to be understood that the appended claims are intended to cover all such modifications and changes as fall within the true spirit of the invention.

What is claimed is:

1. A circuit for amplifying signals received by a receive coil in a magnetic resonance system and for coupling said signals to post-preamplification signal processing electronics, said preamplifier circuit comprising:

a preamplifier having an input and an output;

an input matching network coupled between said receive coil and the input of said preamplifier, said receive coil comprising an integral component of said matching network; and means establishing an optically isolated signal transmission path between the output of said preamplifier and said processing electronics.

2. The circuit of claim 1 wherein said input matching network comprises a capacitance, said capacitance and said receive coil forming a resonant circuit at the frequency of an MR signal to be received by said receive coil.

3. The circuit of claim 2 wherein said capacitive means includes a tunable capacitor for adjusting the resonant frequency of said resonant circuit to said frequency of an MR signal to be received by the receive coil.

4. The circuit of claim 3 wherein said preamplifier comprises a transistor having an optimal noise figure when its input impedance is matched to a specified impedance value;

said capacitive means including an additional capacitor coupled to the input of said preamplifier, said tunable capacitor, said fixed capacitor, and said receive coil being coupled in series so as to provide an impedance substantially equal to said specified impedance value at said frequency of the MR signal.

5. The circuit of claim 4 wherein said transistor comprises a GaAs-MESFET (gallium arsenide metal-semiconductor field-effect transistor).

6. The circuit of claim 4 wherein said transistor comprises a high electron mobility transistor.

7. The circuit of claim 1 wherein said means establishing said optically isolated signal transmission path comprises:

a semiconductor light emitter coupled to the output of said preamplifier;

an optically responsive semiconductor device coupled to the input of said signal processing electronics; and a fiber optic cable optically coupled between said semiconductor light emitter and said optically responsive semiconductor device.

8. The circuit of claim 7 wherein said semiconductor light emitter comprises one of the group consisting of light emitting diodes and laser diodes, and said optically responsive semiconductor device comprises one of the group consisting of photodiodes and solar cells.

9. The circuit of claim 7 including an additional optical transmission path for coupling power to said preamplifier from a remote location.

10. The circuit of claim 9 wherein said additional optical transmission path comprises:

a source of light at said remote location;

an array of optically responsive semiconductor devices;

a second fiber optic cable positioned to convey light from said light source to said array of photodiodes, said array of optically responsive semiconductor devices being operable to convert light received through said second fiber optic cable into electric power; and switching means coupling said array of optically responsive semiconductor devices to said preamplifier for selectively supplying said electric power from said array to said preamplifier.

11. The circuit of claim 10 wherein said switching means is optically responsive and includes a switch for selectively interrupting said electric power to said preamplifier; said circuit further including:

optical communication means for selectively coupling light signals to said switching means for controlling operation of said switching means.

12. The circuit of claim 11 wherein said optical communication means includes a third fiber optic cable positioned to transmit control signals for said switching means.

13. The circuit of claim 7 wherein said semiconductor light emitter comprises a light emitting diode adapted to be cryogenically cooled.

14. A circuit for amplifying signals received by a receive coil in a magnetic resonance system comprising:

a preamplifier having an input and an output, and located proximate to said receive coil;

capacitive means coupled to said receive coil, said capacitive means being coupled to the input of said preamplifier, said capacitive means and said receive coil together forming an input matching network for said preamplifier;

MR signal processing electronics remotely located from said coil and said preamplifier; and means establishing a signal transmission path between the output of said preamplifier and said signal processing electronics.

15. The circuit of claim 14 wherein said signal transmission path comprises a fiber optic cable for transmitting signals from said preamplifier to said signal processing electronics.

16. The circuit of claim 15 including:

means for generating an optical power signal at a remote location;

optically responsive semiconductor means proximate to said preamplifying device for converting said optical power signal into an electric power signal;

a second fiber optic cable for transmitting said optical power signal from said remote location to said optically responsive semiconductor means; and switch means for selectively supplying said electric power signal to said preamplifier.

17. The circuit of claim 16 including a third fiber optic cable for communicating control signals supplied thereto, said third fiber optic cable being positioned to supply said control signals to said switch means so as to drive said switch means into a conductive or nonconductive state in response thereto.

* * * * *